United States Patent
Mori

(10) Patent No.: US 8,098,016 B2
(45) Date of Patent: Jan. 17, 2012

(54) PLASMA GENERATING APPARATUS AND PLASMA GENERATING METHOD

(75) Inventor: Yasunari Mori, Okayama (JP)

(73) Assignee: Mitsui Engineering & Shipbuilding Co., Ltd., Tokyo (JP)

( * ) Notice: Subject to any disclaimer, the term of this patent is extended or adjusted under 35 U.S.C. 154(b) by 779 days.

(21) Appl. No.: 12/294,531

(22) PCT Filed: Mar. 29, 2007

(86) PCT No.: PCT/JP2007/056857
§ 371 (c)(1),
(2), (4) Date: Sep. 25, 2008

(87) PCT Pub. No.: WO2007/114247
PCT Pub. Date: Oct. 11, 2007

(65) Prior Publication Data
US 2010/0236917 A1  Sep. 23, 2010

(30) Foreign Application Priority Data

Mar. 29, 2006 (JP) ................................. 2006-090404

(51) Int. Cl.
*H01J 7/24* (2006.01)
(52) U.S. Cl. ............................ 315/111.21; 315/111.71
(58) Field of Classification Search ............. 315/111.21, 315/111.31, 111.41, 111.51, 111.61, 111.71, 315/34
See application file for complete search history.

(56) References Cited

U.S. PATENT DOCUMENTS

| 6,252,354 | B1 * | 6/2001 | Collins et al. ............ 315/111.51 |
| 6,279,504 | B1 | 8/2001 | Takaki et al. |
| 6,475,335 | B1 * | 11/2002 | Yin et al. ................. 156/345.48 |
| 6,499,424 | B2 * | 12/2002 | Kazumi et al. ............ 118/723 R |
| 6,756,737 | B2 * | 6/2004 | Doi et al. ................. 315/111.51 |
| 2003/0097984 | A1 | 5/2003 | Nakano |

FOREIGN PATENT DOCUMENTS

| EP | 2003 086581 | 3/2003 |
| EP | 1 548 150 | 6/2005 |
| EP | 2005 149887 | 6/2005 |
| EP | 2006 066779 | 3/2006 |
| EP | 2006 278862 | 10/2006 |
| JP | 05-152097 | 6/1993 |
| JP | 2001-257097 | 9/2001 |
| JP | 2003-086581 | 3/2003 |
| JP | 2005-149887 | 9/2005 |

* cited by examiner

Primary Examiner — Douglas W Owens
Assistant Examiner — Minh D A
(74) Attorney, Agent, or Firm — Whitham Curtis Christofferson & Cook, PC

(57) ABSTRACT

An impedance matching device is provided with a basic element having variable characteristic parameters for impedance matching, and an auxiliary element having variable characteristic parameters. At the time of generating plasma by using the impedance matching device, the characteristic parameters of the basic element of each antenna element are fixed, respectively, and the characteristic parameters of the auxiliary element are adjusted for each antenna element. Thus, in an adjusted status where impedance matching for each antenna element is adjusted, each antenna element of an antenna array is fed with a high frequency signal, an electromagnetic wave is radiated from the antenna element, the characteristic parameters of the basic element of each antenna element are synchronized and adjusted, and the impedances of the whole antenna array are matched.

9 Claims, 5 Drawing Sheets

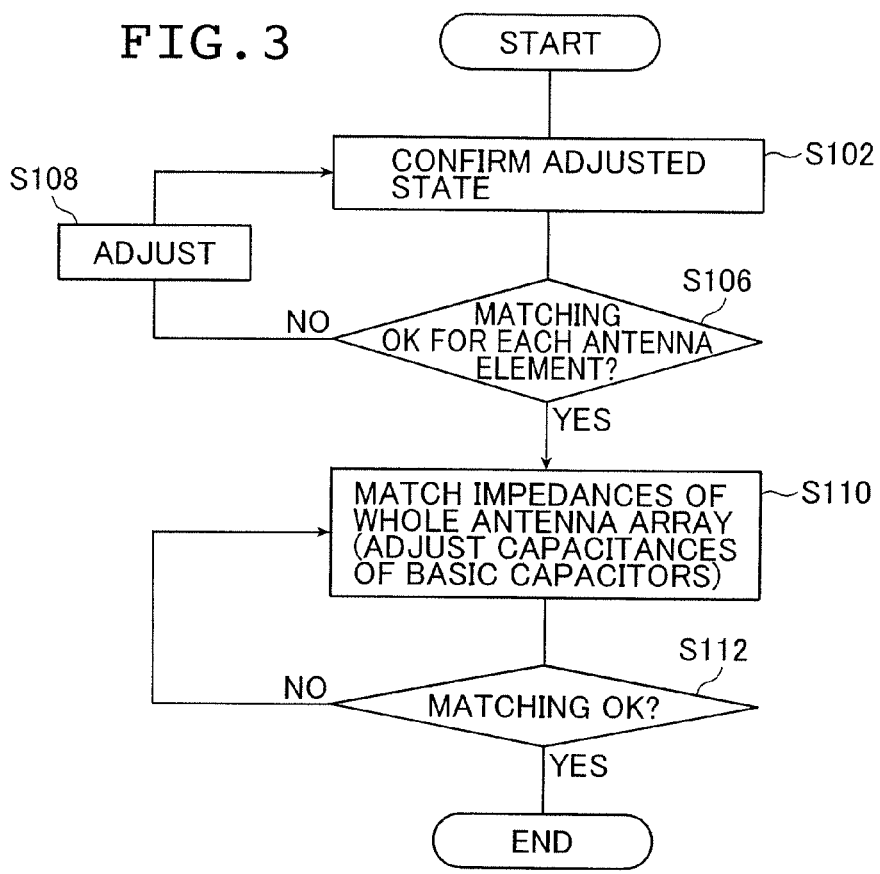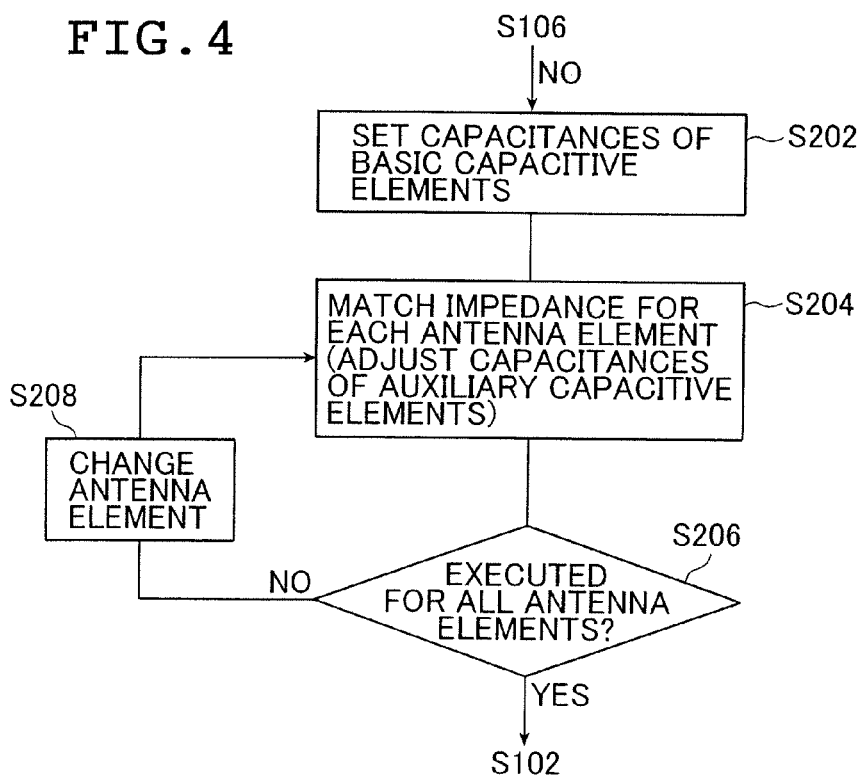

FIG. 5
(a)
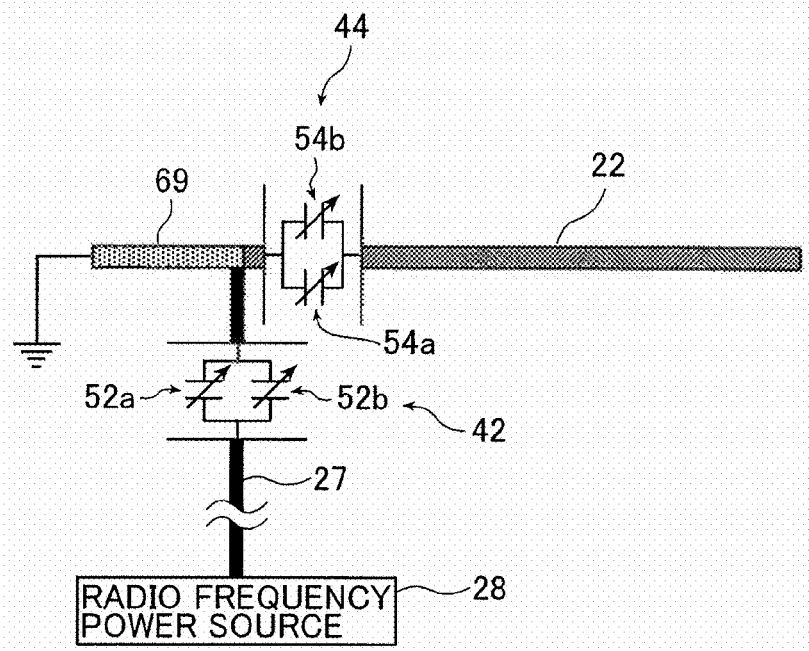
(b)
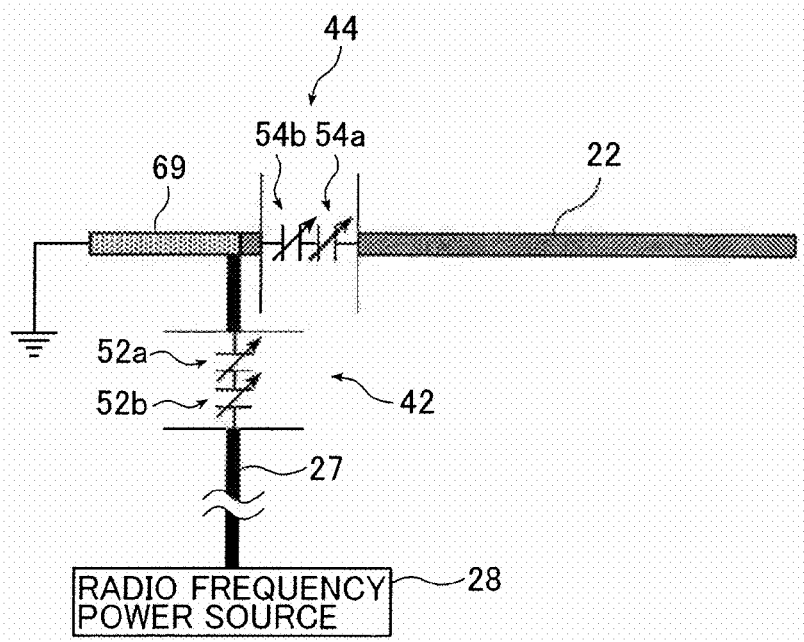

FIG. 6
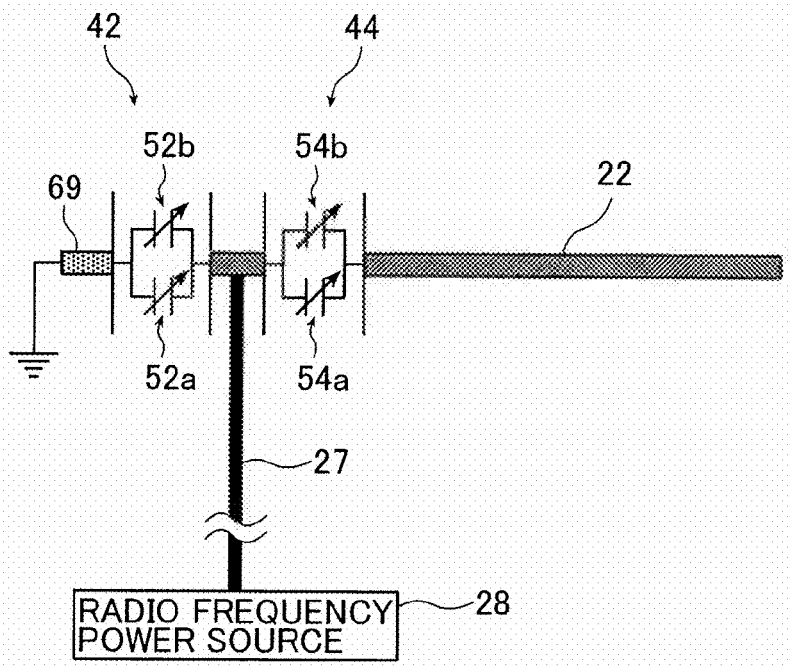
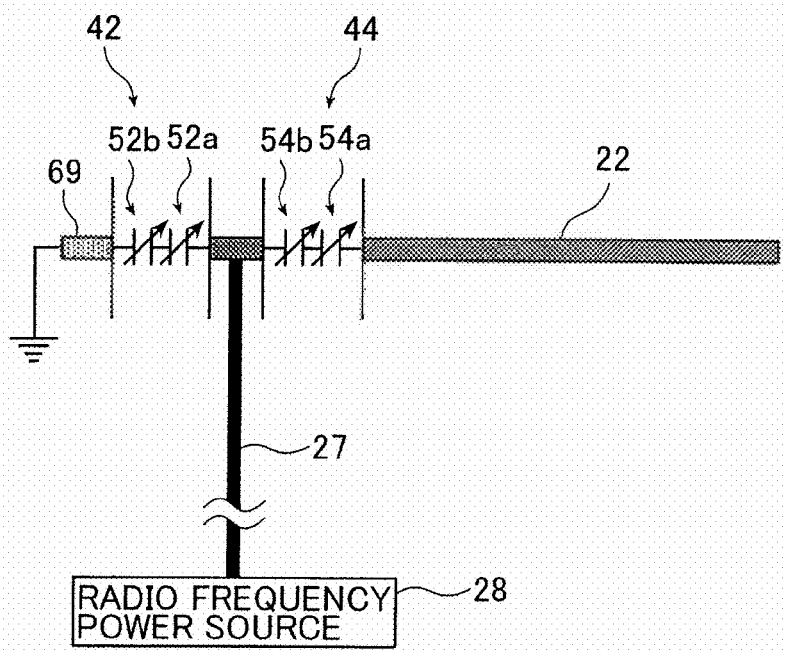

PLASMA GENERATING APPARATUS AND PLASMA GENERATING METHOD

TECHNICAL FIELD

The present invention relates to a plasma generating apparatus and a plasma generating method which are used for a process such as CVD, etching, or sputtering employed for manufacturing a semiconductor, a liquid crystal display, a solar cell, or the like.

BACKGROUND ART

In semiconductor manufacturing apparatuses such as a chemical vapor deposition (CVD) apparatus using plasma, an electromagnetic coupling apparatus using antenna elements is used for generating the plasma.

On the other hand, along with an increase in size of a liquid crystal display or an amorphous solar cell, a semiconductor manufacturing apparatus which uses the plasma to perform each process for processing a substrate having a large area is desired.

Since a frequency of a radio frequency signal used in such a large semiconductor manufacturing apparatus is as high as 10 MHz to 2.5 GHz, a wavelength of the electromagnetic wave emitted from the antenna element is short. Therefore, it is more important to control a plasma density distribution, which affects the uniformity in a process such as film formation, to be uniform.

Under such circumstances, in a plasma CVD apparatus described in Patent Document 1, the use of an antenna for generating a large-area plasma is proposed.

Specifically, an array antenna including a plurality of rod-like antenna elements, each having a surface covered with a dielectric, arranged in a planar manner is used to uniformize a spatial distribution of the electromagnetic wave. Then, the electromagnetic wave is used for generating a large-area plasma.

Patent Document 1: JP 2003-86581 A

Each of the plurality of antenna elements constituting such an antenna array is designed and manufactured to allow a characteristic parameter such as a capacitance or a resistance, which affects an impedance matching state, to provide reflected power of 0% (to provide the best impedance matching state) when radio frequency power is fed.

However, a mechanical manufacturing error is inevitably generated in, for example, the rod-like conductor forming the antenna element, the dielectric (for example, quartz) covering the surface, or a wiring state of a matching circuit for adjusting the impedance matching state. Even when the plasma is generated by using each antenna array configured based on an initial design, the impedance matching state of each of the antenna elements does not become the same as a design value (specifically, the reflected power does not become 0% for all the antenna elements) in many cases due to the error as described above. Therefore, it is necessary to adjust the impedance matching state in advance for each of the antenna elements. Such adjustment of the impedance matching state is necessary not only for the plasma generating apparatus using the array antenna but also for plasma generating apparatuses using other configurations.

DISCLOSURE OF THE INVENTION

Problems to be Solved by the Invention

The plasma CVD apparatus described in Patent Document 1 is characterized in that the multiple antenna elements of the array antenna affect each other by the effects of the plasma generated by the emission of the electromagnetic waves from the antenna elements and mutually change a load on each of the antenna elements, resulting in a change in impedance matching of each of the antenna elements.

For example, it is assumed that the impedance matching is adjusted alternately for a first antenna element and a second antenna element, which are two neighboring antenna elements. First, it is assumed that reflected power from the first antenna element is improved from 10% to 0% by adjusting the impedance matching state for the first antenna element. Then, a plasma density around the first antenna changes to be higher. This change varies a plasma impedance (load) around the neighboring second antenna element. In this case, the reflected power from the second antenna element inevitably changes to increase, for example, from an initial value of 0% to 10%. In other words, when the impedance matching state of the first antenna element is changed (for example, improved), the impedance matching state of the second antenna element also changes (for example, deteriorates). Then, on the contrary, when the impedance matching state of the second antenna element is changed to reduce the reflected power from the second antenna element (for example, to change the reflected power from 10% to 0%), it is natural that the reflected power from the first antenna element increase.

Conventionally, it is difficult to simultaneously adjust the impedance matching states of a plurality of antenna elements as described above. Therefore, conventionally, the different impedance matching state for each antenna element provides nonuniform emission of the electromagnetic wave from each antenna element, which prevents a density distribution of the generated plasma from being uniform in some cases. As a result, there is a problem that the generated plasma distribution becomes nonuniform, resulting in an uneven film formed by the CVD or the like.

Therefore, in order to solve the above-mentioned problem, the present invention has an object to provide a plasma generating apparatus having a simple apparatus configuration which can more quickly and easily perform impedance matching with high accuracy to uniformize a plasma when the plasma is generated by using an array antenna including a plurality of antenna elements, each being formed of a rod-like conductor having a surface covered with a dielectric, arranged in parallel and in a planar manner, and a plasma generating method for realizing such plasma generation.

Means to Solve the Problems

In order to achieve the above-mentioned object, the present invention provides a plasma generating apparatus using an antenna array including a plurality of antenna elements, each being formed of a rod-like conductor having a surface covered with a dielectric, and arranged in a planar manner, the plasma generating apparatus comprising: a radio frequency power source for generating a radio frequency signal fed to each of the plurality of antenna elements of the antenna array; impedance matching devices, each including a basic element having a characteristic parameter being variable for impedance matching and an auxiliary element having a characteristic parameter being variable, the impedance matching devices changing a combined characteristic parameter obtained by combining the characteristic parameter of the basic element and the characteristic parameter of the auxiliary element to change an impedance matching state of each of the plurality of antenna elements; and a controller for adjusting an amount of the combined characteristic parameter of each of the impedance matching devices to perform the impedance matching of the whole antenna array, wherein, in an adjusted state where the characteristic parameter of the auxiliary element is adjusted for each of the plurality of antenna elements to adjust the impedance matching for each of the plurality of antenna elements, the controller adjusts the characteristic parameter of the basic element of each of the plurality of antenna elements in synchronization with each other so as to perform the impedance matching of the whole antenna array.

Additionally, it is preferable that, in the adjusted state, the controller increases or decreases the amount of the characteristic parameter of the basic element of each of the plurality of antenna elements by the same amount to perform the impedance matching of the whole antenna array.

Also, it is preferable that the adjusted state is a state where the characteristic parameter of the auxiliary element is adjusted for each of the plurality of antenna elements while the characteristic parameters of the basic elements of all the plurality of antenna elements are fixed to the same amount to adjust the impedance matching for each of the plurality of antenna elements, and the controller adjusts the characteristic parameter of the basic element of each of the plurality of antenna elements to the same amount to perform the impedance matching of the whole antenna array.

Further, it is preferable that each of the impedance matching devices provided for each of the plurality of antenna elements includes a first parameter adjusting means connected to a power feeder for feeding the radio frequency signal to the plurality of antenna elements and a second parameter adjusting means joined with the antenna element, and the basic element and the auxiliary element are provided for each of the first capacitance adjusting means and the second capacitance adjusting means.

Furthermore, it is preferable that, in the first parameter adjusting means, a terminal of the basic element, the terminal being opposite to a side connected to the power feeder, and a terminal of the auxiliary element, the terminal being opposite to a side connected to the power feeder, are both connected to a grounded stub provided for the impedance matching of each of the plurality of antenna elements; and in the second parameter adjusting means, a terminal of the basic element, the terminal being opposite to a side connected to the plurality of antenna elements, and a terminal of the auxiliary element, the terminal being opposite to a side connected to the plurality of antenna elements, are both connected to the stub.

Moreover, it is preferable that the characteristic parameter comprises a capacitance parameter for the impedance matching, and each of the basic element and the auxiliary element comprises a capacitive element having the capacitance parameter being variable. In addition, the basic element and the auxiliary element can be an inductance element (an inductor element).

The present invention also provides a plasma generating method for generating a plasma by using an antenna array and impedance matching devices, the antenna array including a plurality of antenna elements, each being formed of a rod-like conductor having a surface covered with a dielectric, arranged in a planar manner, the impedance matching devices, each including a basic element having a characteristic parameter being variable for impedance matching, and an auxiliary element having a characteristic parameter being variable, the impedance matching devices changing a combined characteristic parameter obtained by combining the characteristic parameter of the basic element and the characteristic parameter of the auxiliary element to change an impedance matching state of each of the plurality of antenna elements, the plasma generating method comprising: in an adjusted state where the characteristic parameter of the auxiliary element is adjusted for each of the plurality of antenna elements while the characteristic parameter of the basic element of each of the plurality of respective antenna elements is fixed to adjust impedance matching for each of the plurality of antenna elements; feeding a radio frequency signal to each of the plurality of antenna elements of the antenna array to cause an electromagnetic wave to be emitted from the plurality of antenna elements to generate the plasma; and adjusting the characteristic parameter of the basic element of each of the plurality of antenna elements in synchronization with each other to perform the impedance matching of the whole antenna array.

It is also preferable that, when the impedance matching of the whole antenna array is performed, an amount of the characteristic parameter of the basic element of each of the plurality of antenna elements is increased or decreased by the same amount in the adjusted state to perform the impedance matching of the whole antenna array.

It is further preferable that the characteristic parameters of the basic elements of all the plurality of antenna elements are fixed to the same amount prior to generation of the plasma to generate the plasma in a fixed state, and the characteristic parameter of the auxiliary element is adjusted for each of the plurality of antenna elements so as to make reflection of radio frequency power zero to set the adjusted state where the impedance matching is adjusted for each of the plurality of antenna elements.

Effects of the Invention

The present invention provides each antenna element, which is formed of a rod-like conductor having a surface covered with a dielectric, with an impedance matching device including a basic element having a variable characteristic parameter for impedance matching and an auxiliary element also having a variable characteristic parameter. Then, for each antenna element, the characteristic parameter of the auxiliary element is adjusted, while the characteristic parameter of the basic element is fixed, to obtain an adjusted state where the impedance matching of each of the antennas is individually adjusted. In the adjusted state, only the characteristic parameters of the basic elements are adjusted in synchronization for all the antenna elements. In this manner, the impedances of the whole antenna array are matched. Therefore, in the present invention, the characteristic parameters of the auxiliary elements can be adjusted to enable the correction of a variation in characteristic parameter for each of the antenna elements, which is generated by processing accuracy of the antenna or the like. As a result, by adjusting only the characteristic parameters of the basic elements in synchronization for all the antenna elements, the impedances of the whole antenna array can be matched. In other words, in the present invention, the impedance matching can be more quickly and easily performed with high accuracy.

BRIEF DESCRIPTION OF THE INVENTION

FIG. 3 is a flowchart of an example of a plasma generating method according to the present invention, which is carried out by using the CVD apparatus illustrated in FIG. 1.

FIG. 4 is a flowchart illustrating impedance matching of each antenna element, which is performed in the CVD apparatus illustrated in FIG. 1, in more detail.

FIG. 5 illustrates examples of a connection relation between first capacitance adjusting means and second capacitance adjusting means, a connection relation between a first basic element and a first auxiliary element, and a connection relation between a second basic element and a second auxiliary element in the CVD apparatus illustrated in FIG. 1.

FIG. 6 illustrates other examples of the connection relation between the first capacitance adjusting means and the second capacitance adjusting means, the connection relation between the first basic element and the first auxiliary element, and the connection relation between the second basic element and the second auxiliary element in the CVD apparatus illustrated in FIG. 1.

DESCRIPTION OF SYMBOLS

Figure 1:
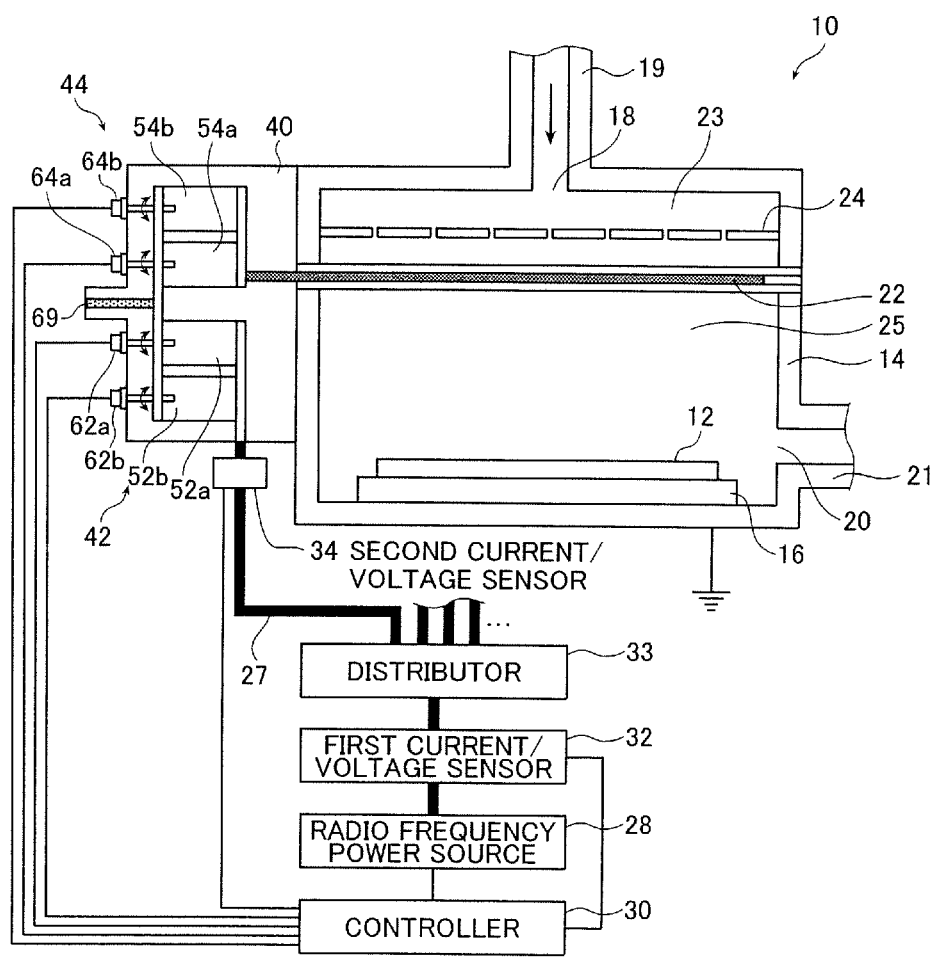
FIG. 1 is a schematic sectional view illustrating a configuration of a plasma CVD apparatus corresponding to an embodiment of a plasma reaction processing apparatus according to the present invention.

10 CVD apparatus
12 substrate to be processed
14 reaction container
16 substrate table
18 inlet port
19 supply pipe
20 exhaust port
22 antenna element
23 material gas dispersion chamber
24 gas dispersion plate
25 reaction chamber
27 power feeder
28 radio frequency power source
30 controller
32 first current/voltage sensor
34 second current/voltage sensor
40 impedance matching device
42 first capacitance adjusting means
44 second capacitance adjusting means
52$a$ first basic element
52$b$ first auxiliary element
54$a$ second basic element
54$b$ second auxiliary element
62$a$ first basic motor
62$b$ first auxiliary motor
64$a$ second basic motor
64$b$ second auxiliary motor

BEST MODE FOR CARRYING OUT THE INVENTION

Hereinafter, a plasma generating apparatus and a plasma generating method of the present invention will be described in detail.

Figure 2:
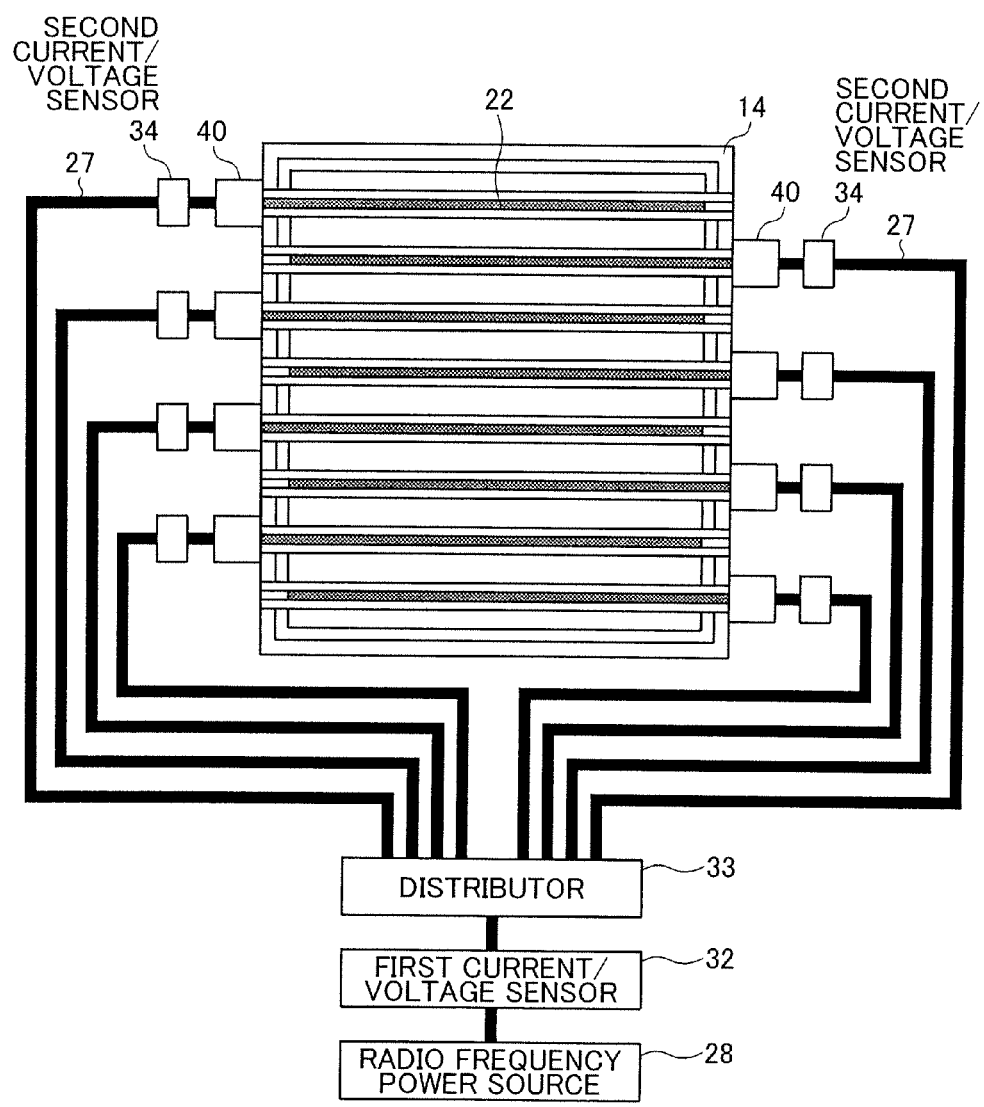
FIG. 2 is a schematic top view illustrating an arrangement of antenna elements in the CVD apparatus illustrated in FIG. 1.

FIG. 1 is a schematic configuration view illustrating a configuration of a plasma CVD apparatus 10 corresponding to an embodiment of a plasma generating apparatus according to the present invention. FIG. 2 is a view illustrating an arrangement of antenna elements of the CVD apparatus 10. In FIG. 2, a power feeder for transmitting a radio frequency signal is illustrated, whereas a controller and a control line for impedance matching described below are not illustrated.

The CVD apparatus 10 employs plasma CVD to perform a film formation process on a substrate to be processed 12 such as a glass substrate or a silicon wafer.

The CVD apparatus 10 includes a reaction container 14, a substrate table 16 on which the substrate to be processed 12 is placed, an inlet port 18 provided to a wall surface of the reaction container 14, from which a material gas is introduced, an exhaust port 20 provided to the wall surface of the reaction container 14, from which the material gas or the like is exhausted to reduce a pressure, a gas dispersion plate 24 provided in the reaction container 14 to release the material gas to a reaction chamber, a plurality of antenna elements 22 provided in the reaction container 14, impedance matching devices 40 provided outside the reaction container 14, a radio frequency power source 28 for feeding power to the antenna elements 22, a controller 30 for controlling the radio frequency power source 28 and the impedance matching devices 40, a first current/voltage sensor 32 for detecting a current and a voltage of a radio frequency signal fed to the antenna elements 22, a second current/voltage sensor 34 for detecting a current and a voltage for individually adjusting the impedance matching devices 40, and a distributor 33 provided between the first current/voltage sensor 32 and the second current/voltage sensor 34.

The reaction container 14 is a container made of a metal and has a grounded wall surface.

The substrate table 16 is a table, on which the substrate to be processed 12 is placed opposite to the antenna elements 22. A heat generating member (not shown) for heating the substrate to be processed 12 is provided inside the substrate table 16. A grounded electrode plate (not shown) is further provided inside the substrate table 16. The electrode plate may be connected to a bias power source to be applied with a bias voltage.

The inlet port 18 is provided on an upper surface side of the reaction container 14, and is connected to a supply pipe 19 for supplying the material gas. The supply pipe 19 is connected to a material gas source (not shown). The material gas supplied from the inlet port 18 differs depending on the type of film formation. For example, in the case of low-temperature polysilicon TFT liquid crystal, a silane gas is suitably used for manufacturing a silicon film, additionally TEOS is suitably used for manufacturing a gate insulating film.

In an upper part of the reaction container 14, a material gas dispersion chamber 23 is constituted to be separated by the gas dispersion plate 24 from a reaction chamber 25 situated in a lower part thereof.

The gas dispersion plate 24 is a plate-like member formed of a conductive material (anodized aluminum or the like), which is provided with a plurality of through holes, each being about 0.5 mm, and allows the material gas to be dispersed at a constant flow rate to the lower reaction chamber 25. Note that the gas dispersion plate 24 may be made of a ceramic material or may be a plate-like material film-formed by the CVD. When the gas dispersion plate 24 is a plate-like material film-formed by the CVD, a metal film is formed on the gas dispersion plate 24 and is grounded.

The exhaust port 20 is connected to an exhaust pipe 21 connected to a vacuum pump (not shown) for creating a material gas atmosphere at a pressure reduced to a predetermined pressure in the reaction container 14.

In the upper part of the reaction chamber 25 below the gas dispersion plate 24, the plurality of the antenna elements 22 arranged in an array is provided opposite to the gas dispersion plate 24.

The multiple antenna elements 22 are arranged in parallel to each other and in a planar manner as illustrated in FIG. 2 to form an array antenna comprising monopole antennas. The array antenna is provided to be parallel to the gas dispersion plate 24 and the substrate to be processed 12, which is placed on the substrate table 16.

The antenna element 22 corresponding to a monopole antenna protrudes from the wall surface of the reaction container 14 in a direction opposite to a direction of the neighboring antenna element 22 as illustrated in FIG. 2 to provide alternate power feeding directions. The antenna elements 22 are respectively connected to the impedance matching devices 40, each corresponding to a matching box.

Each of the antenna elements 22 is formed of a rod-like (may also be a pipe-like) conductor having a high electric conductivity and has an emission length (2n+1)/4 times (n is 0 or a positive integer) as large as a wavelength of a used radio frequency. A surface of each of the antenna elements 22 is covered with a dielectric such as a quartz tube. By covering the rod-like conductor with the dielectric, a capacitance and an inductance as the antenna element 22 are adjusted. As a result, a radio frequency current can be efficiently propagated along the direction of protrusion of the antenna element 22 to allow an electromagnetic wave to be efficiently emitted.

The antenna element 22 covered with the dielectric as described above is connected to an opening provided through an inner wall of the reaction container 14 in an electrically insulated manner. The radio frequency current supply end side of the antenna element 22 is connected to the impedance matching device 40.

Since the antenna elements 22 are provided in the vicinity of the gas dispersion plate 24, the electromagnetic waves emitted from the neighboring antenna elements 22 do not mutually affect to allow the electromagnetic wave emitted from the antenna element 22 to react with an electromagnetic wave formed in a mirror image relation by the effect of the grounded metal film of the gas dispersion plate 24. As a result, a predetermined electromagnetic wave is formed on each of the antenna elements. Further, each of the antenna elements 22 constituting the array antenna has the power feeding direction opposite to the power feeding direction of the adjacent antenna element 22, and hence the intensity of the electromagnetic waves are uniformly formed in the reaction chamber 25.

The impedance matching device 40 includes a first capacitance adjusting means 42 connected to the power feeder 27 and a second capacitance adjusting means 44 joined with the antenna element 22. The first capacitance adjusting means 42 includes a first basic element 52a, a first auxiliary element 52b, a first basic motor 62a, and a first auxiliary motor 62b. The second capacitance adjusting means 44 includes a second basic element 54a, a second auxiliary element 54b, a second basic motor 64a, and a second auxiliary motor 64b. The impedance matching device 40 is provided with a stub 69 for impedance matching of the antenna elements. A casing of the impedance matching device 40 is connected (electrically connected) to the grounded reaction container 14. The stub 69 is grounded while being connected to the casing of the impedance matching device 40.

For each of the first basic element 52a and the first auxiliary element 52b, a distance between electrodes constituting a capacitive element is variably configured to allow the capacitance (characteristic parameter) to be freely adjusted. For each of the first basic element 52a and the first auxiliary element 52b included in the first capacitance adjusting means 42, one of the electrodes is connected to the power feeder 27, and the other electrode is connected to the stub 69 to be grounded. The capacitances are adjusted respectively by the first basic motor 62a and the first auxiliary motor 62b which move the electrodes. In the first capacitance adjusting means 42, the capacitances of the first basic element 52a and the first auxiliary element 52b are individually adjusted by the first basic motor 62a and the first auxiliary motor 62b, respectively. As a result, a combined capacitance of the first basic element 52a and the first auxiliary element 52b is adjusted. Hereinafter, the combined capacitance of the first basic element 52a and the first auxiliary element 52b is referred to as a power feeder side combined capacitance.

Similarly, for each of the second basic element 54a and the second auxiliary element 54b, a distance between electrodes constituting a capacitive element is variably configured to allow the capacitance (characteristic parameter) to be freely adjusted. For each of the second basic element 54a and the first auxiliary element 54b included in the second capacitance adjusting means 44, one of the electrodes is connected to (the conductor of) the antenna element 22, and the other electrode is connected to the stub 69 to be grounded. The capacitances are adjusted respectively by the second basic motor 64a and the second auxiliary motor 64b which move the electrodes. In the second capacitance adjusting means 44, the capacitances of the second basic element 54a and the second auxiliary element 54b are individually adjusted by the second basic motor 64a and the second auxiliary motor 64b, respectively. As a result, a combined capacitance of the second basic element 54a and the second auxiliary element 54b is adjusted. Hereinafter, the combined capacitance of the second basic element 54a and the second auxiliary element 54b is referred to as an antenna element side combined capacitance.

Note that the stub 69 is a known stub for so-called stub matching, and is a short part of a transmission line of the radio frequency current, including the antenna element 22, which is connected to the antenna element 22 to contribute to the impedance matching of the antenna element 22. The stub 69 has a length of about 30% of 1/4λ of a wavelength λ of the used radio frequency (length corresponding to about 7.5% of the wavelength λ) and is connected to the casing of the impedance matching device 40 to be grounded.

The adjustment of the power feeder side combined capacitance and the adjustment of the antenna line side combined capacitance described above are performed to correct impedance mismatching which is caused by a variation in load on the antenna elements 22 during the generation of the plasma. As described below, when the impedance mismatching is corrected (specifically, the impedance matching state is adjusted) for each of the antenna elements prior to the processing of the substrate with the plasma (specifically, prior to the actual process), the capacitances of the first auxiliary element 52b and the second auxiliary element 54b are individually adjusted while the capacitances of the first basic element 52a and the second basic element 54b are fixed, thereby adjusting the power feeder side combined capacitance and the antenna line side combined capacitance (putting the power feeder side combined capacitance and the antenna line side combined capacitance into an adjusted state). Then, when the substrate is actually processed with the plasma (specifically, in the actual process), the capacitances of the first basic element 52a and the second basic element 54a of each of the antenna elements are adjusted in synchronization for all the antenna elements 22 without changing the capacitances of the first auxiliary element 52b and the second auxiliary element 54b from the adjusted state. In this manner, the impedances of the whole antenna array are matched.

The radio frequency power source 28 includes a radio frequency oscillator circuit and an amplifier (not shown), and is configured to vary an oscillation frequency according to a signal from the controller 30.

The controller 30 is a control section for changing the oscillation frequency of the radio frequency power source 28 and adjusting the impedance matching device 26 according to detection signals of the first current/voltage sensor 32 and the second current/voltage sensor 34 described below. An oscillation frequency of a radio frequency transmitting circuit can be changed according to a difference in process performed on the substrate. In various impedance matching operations described below, for fine adjustment of the impedance matching state, the oscillation frequency of the radio frequency transmitting circuit may be finely adjusted. Note that, for the use in the process which does not require the change or fine adjustment of the oscillation frequency or the like, the oscillation frequency of the radio frequency power source 28 is not required to be variable.

The first current/voltage sensor 32 is a section for detecting a current and a voltage in the vicinity of an output terminal of the radio frequency power source 28 to detect whether or not the radio frequency signal from the radio frequency power source 28 is fed to the antenna element 22 in the impedance matching state. The first current/voltage sensor 32 is connected to the impedance matching device 40 through the distributor 33. The second current/voltage sensor 34 is a section which is individually provided in the vicinity of an input terminal of each of the impedance matching devices 40 to detect a current and a voltage for adjusting each of the impedance matching devices 40. When the impedance matching is not achieved, a reflected wave of the radio frequency signal is generated in a joint between the power feeder 27 and the antenna element 22 to generate a phase difference between the current and the voltage. Therefore, by detecting the current and the voltage with each of the first current/voltage sensor 32 and the second current/voltage sensor 34, the impedance matching or mismatching state can be detected for each of the antenna elements. The detection signals from the first current/voltage sensor 32 and the second current/voltage sensor 34 are fed to the controller 30.

The controller 30 determines based on the detection signals from the first current/voltage sensor 32 and the second current/voltage sensor 34 whether or not the impedance matching state is established for each of the antenna elements. Further, according to the result of determination, the controller 30 generates a control signal for controlling the adjustment operation of the capacitances in the impedance matching device 40 to feed the thus generated control signal to the first basic motor 62a, the first auxiliary motor 62b, the second basic motor 64a, and the second auxiliary motor 64b. When the impedance matching state is adjusted for each of the antenna elements prior to the actual process, the controller 30 feeds the control signals individually to the first auxiliary motor 62b and the second auxiliary motor 64b to individually adjust the capacitances of the first auxiliary element 52b and the second auxiliary element 54b, thereby adjusting the power feeder side combined capacitance and the antenna line side combined capacitance.

Then, in the actual process, the controller 30 simultaneously transmits control signals to the first basic motors 62a of the antenna elements 22 to drive the first basic motors 62a of the respective antenna elements by the same amount to change the capacitances of the first basic elements 52a of the respective antenna elements by the same amount. Besides, simultaneously, the controller 30 transmits a control signal to the second basic motors 64a of the respective antenna elements 22 to drive the second basic motors 64a of the respective antenna elements 22 by the same amount to change the capacitances of the second basic element 64a of the respective antenna elements by the same amount. In this manner, the capacitances of the first basic elements 52a and the second basic elements 54a of the respective antenna elements are adjusted in synchronization for all the antenna elements 22, thereby matching the impedances of the whole antenna array.

Note that both the first current/voltage sensor 32 and the second current/voltage sensor 34 are provided in this embodiment, but any one of the current/voltage sensors is sufficient in the present invention. For more precise control, however, it is preferred to provide both the first current/voltage sensor 32 and the second current/voltage sensor 34.

In the CVD apparatus 10 as described above, the material gas is fed from the inlet port 18 into the reaction container 14. On the other hand, a vacuum pump (not shown), which is connected to the exhaust port 20, is operated to create a vacuum atmosphere normally at 1 Pa to about several hundreds of Pa in the reaction container 14. When the radio frequency signal is fed to the antenna element 22 in this state, the electromagnetic wave is emitted around the antenna element 22. As a result, the plasma is generated in the reaction container 14, while the material gas fed from the gas dispersion plate 24 is excited to generate a radical. At this time, the generated plasma has conductivity, and hence the electromagnetic wave emitted from the antenna element 22 is likely to be reflected by the plasma. Therefore, the electromagnetic wave is localized in a local area around the antenna element 22.

As a result, the plasma is formed in a localized manner in the vicinity of the antenna element 22.

At this time, because the localized plasma is generated around the antenna element 22 which emits the electromagnetic wave, the load on the antenna element 22 also varies. Therefore, the impedance matching state of the antenna element 22 changes into the impedance mismatching state also due to a manufacturing error of each antenna element or the like. In the impedance mismatching state, a reflectance of the radio frequency signal fed from the radio frequency power source 28 in the joint between the power feeder 27 and the antenna element 22 increases to prevent sufficient power feeding. In this case, because the variation in load varies for each antenna element 22, the mismatching state in each of the antenna elements 22 also varies. Therefore, the electromagnetic wave emitted from the antenna element 22 also has a distribution. As a result, a density distribution of the generated plasma also varies in a space.

Such a spatial variation of the density distribution of the plasma is not preferable for the film formation processing of the substrate to be processed 12 or the like. Therefore, the impedance matching is required to be performed for each of the antenna elements 22 to allow the emission of the electromagnetic wave from each of the antenna elements 22 to be constant to generate a uniform plasma. A difference in error component of the characteristic parameter due to the manufacturing error or the like as described above for each antenna element is smaller as compared with the actual design value of the characteristic parameter. If such a difference in error component is eliminated in advance for each of the antenna elements, each antenna element has the characteristic parameter which is the same as the design value. In this state, only by adjusting the frequency of the radio frequency voltage which is fed in common to the antenna elements or a component of the characteristic parameter other than the error component in each of the antenna elements, the variation in load on each of the antenna elements 22 is remarkably reduced to remarkably reduce the mismatching state in each of the antenna elements 22.

The present invention is devised by the inventor of the present application who has focused attention on the above-mentioned point, and is characterized by adjusting only the basic characteristic parameter components of the respective antenna elements in synchronization for all the antennas after the error component of the characteristic parameter due to the manufacturing error or the like is eliminated. Hereinafter, an example of a plasma generating method according to the present invention, which is carried out by using the apparatus 10, will be described.

FIG. 3 is a flowchart of an example of the plasma generating method according to the present invention, which is carried out by using the CVD apparatus 10. First, the plasma is generated in the reaction container 14. An adjusted state of each of the antenna elements 22 is confirmed while the plasma is formed in a localized manner in the vicinity of the antenna element 22 (Step S102). Specifically, for each of the antenna elements 22, information of the currents and voltages detected by the first current/voltage sensor 32 and the second current/voltage sensor 34 is fed as a detection signal to the controller 30. The controller 30 determines, for all the antenna elements 22, whether or not a phase difference between the current and voltage of the fed radio frequency signal satisfies a predetermined condition (for example, is equal to zero) (Step S106).

When the result of determination in Step S106 is NO, specifically, the impedance mismatching is observed in any of the plurality of antenna elements 22, the impedance matching is performed for each of the antenna elements 22 (Step S108).

FIG. 4 is a flowchart illustrating the impedance matching for each of the antenna elements 22 in Step S108 in more detail. First, for each of the impedance matching devices 40 provided respectively for the antenna elements, the capacitance of the first basic element 52a of the first capacitance adjusting means 42 and the capacitance of the second basic element 54a of the second capacitance adjusting means 44 are set (Step S202). As the capacitances set at this time, for example, it is preferred to set capacitances (design value capacitances) preset according to the frequency of the fed radio frequency voltage. Note that the setting of the capacitances is not limited thereto. For example, only the capacitances of the first basic element 52a and the second basic element 54a may be individually changed for each of the antenna elements 22 to perform the impedance matching for each of the antenna elements 22, thereby setting the capacitances of the first basic element 52a and the second basic element 54a. In this case, the capacitances of the first basic element 52a and the second basic element 54a when the best impedance matching is achieved (the phase difference between the current and the voltage of the radio frequency signal is the closest to 0) may be set for each of the antenna elements 22.

Then, in the state where the capacitances of the first basic element 52a and the second basic element 54a are set to constant values for each of the antenna elements 22, the capacitances of the first auxiliary element 52b and the second auxiliary element 54b are individually adjusted while the capacitances of the first basic element 52a and the second basic element 54a are fixed. In this manner, the power feeder side combined capacitance and the antenna line side combined capacitance are adjusted to perform the impedance matching for each of the antenna elements 22.

Specifically, the impedance matching of the antenna element 22 is performed by individually adjusting the capacitances of the first auxiliary element 52b and the second auxiliary element 54b to make the phase difference between the current and the voltage of the fed radio frequency signal equal to zero and to match the impedance of the antenna element 22 and the impedance of the power feeder 27 (for example, 50 ohms) with each other through the first capacitance adjusting means 42 and the second capacitance adjusting means 44. In such adjustment, the information of the currents and the voltages detected by the first current/voltage sensor 32 and the second current/voltage sensor 34 is fed as the detection signal to the controller 30. The controller 30 sets the power feeder side combined capacitance and the antenna line side combined capacitance based on the detection signal to generate control signals for controlling the first auxiliary motor 62b and the second auxiliary motor 64b. In this manner, the control signals are fed to the first auxiliary motor 62b and the second auxiliary motor 64b to perform the impedance matching between the antenna element 22 and the signal line 27.

The impedance matching performed by individually adjusting the first auxiliary element 52b and the second auxiliary element 54b is repeated until the impedance matching is executed for all the antenna elements 22 constituting the array antenna (Steps S206, S208, and S204). If the impedance matching state has been adjusted for all the antenna elements 22, the adjusted state is confirmed in Step S102. In this case, the result of confirmation in Step S106 is OK to perform the impedance matching for the whole antenna array (Step S110).

In Step S110, the capacitances of the first basic element 52a and the second basic element 54a of each of the antenna elements are adjusted in synchronization for all the antenna elements 22 to match the impedances of the whole antenna array. For the impedance matching of the whole antenna array, specifically, the capacitances of the first basic element 52a and the second basic element 54a of each of the antenna elements are adjusted in synchronization for all the antenna elements 22 to make the reflected power of the fed radio frequency signal zero for each of the antenna elements 22, resulting in zero reflected power of the radio frequency signal fed to the whole antenna array.

In such adjustment, the information of the currents and the voltages detected by the first current/voltage sensor 32 and the second current/voltage sensor 34 is supplied as the detection signal to the controller 30. Based on the detection signal, the controller 30 transmits the control signal to drive the first basic motors 62a of the respective antenna elements by the same amount to change the capacitances of the first basic elements 52a of the respective antenna elements by the same amount. Simultaneously, the controller 30 also transmits the control signal to the second basic motors 64a of the respective antenna elements 22 to drive the second basic motors 64a of the respective antenna elements 22 by the same amount to change the capacitances of the second basic elements 64a of the antenna elements by the same amount. As a result, the capacitances of the first basic elements 52a and the second basic elements 54a of the respective antenna elements are adjusted in synchronization for all the antenna elements 22 to match the impedances of the whole antenna array. The impedance matching for adjusting the first basic elements 52a and the second basic elements 54a in synchronization as described above is repeated until the impedances of the whole antenna array are matched.

As described above, in the present invention, the first auxiliary element 52b and the second auxiliary element 54b can be individually adjusted to eliminate a difference in error component of the characteristic parameter due to the manufacturing error or the like for each antenna element. As a result, only by adjusting the first basic elements 52a and the second basic elements 54a alone in synchronization for all the antenna elements, the impedances of the whole antenna array can be matched. In other words, the impedance matching can be more quickly and easily performed with high accuracy.

FIG. 5(a) is a view illustrating connection relations between the first capacitance adjusting means 42 and the second capacitance adjusting means 44, between the first basic element 52a and the first auxiliary element 52b, and between the second basic element 54a and the second auxiliary element 54b in the impedance matching device 40 of the CVD apparatus 10 illustrated in FIG. 1. FIG. 5(b), and FIGS. 6(a) and 6(b) are views illustrating other examples of the connection relations in the respective means and the elements. The first capacitance adjusting means 42 and the second capacitance adjusting means 44 may not only be connected in parallel as in the examples illustrated in FIGS. 5(a) and 5(b) but also be connected in series as in the examples illustrated in FIGS. 6(a) and 6(b). Moreover, the first basic element 52a and the first auxiliary element 52b of the first capacitance adjusting means 42, and the second basic element 54a and the second auxiliary element 54b of the second capacitance adjusting means 44 may not only be connected in parallel as in the examples illustrated in FIG. 5(a) and FIG. 6(a), but also be connected in series as in the examples illustrated in FIG. 5(b) and FIG. 6(b), respectively. In any case, by controlling the capacitances of the respective elements, the impedance matching between the antenna element 22 and the signal line 27 can be performed.

Note that the capacitive element (capacitor) is used for the impedance matching of the antenna elements 22 in this embodiment, but an inductor may be used to control an inductance (characteristic parameter).

In the impedance matching for each of the antenna elements 22 by individually adjusting the capacitances of the first auxiliary element 52b and the second auxiliary element 54b, the impedance matching may be performed for each of the antenna elements 22 while the radio frequency power is individually supplied to each of the antenna elements 22 to discharge the plasma under the same conditions (a pressure, the type of gas, a gas flow rate, RF power, a frequency of the RF, and the like) for each of the antennas. However, when the impedance matching state with accuracy as high as possible is set in the actual process, it is preferred to perform the impedance matching for each of the antenna elements while the radio frequency power is supplied to the whole antenna array including the plurality of antenna elements 32 as in the above-described embodiment. In this case, it is preferred to generate the plasma in the state where the pressure is relatively high (for example, 130 Pa) to perform the adjustment in the state where the plasma is localized closer to the antenna with a relatively small interference between the antennas.

The capacitances of only the capacitive elements are controlled in the embodiment described above, but the frequency of the radio frequency signal may be finely adjusted in addition to the capacitances of the capacitive elements for precisely performing the impedance matching in the present invention.

The plasma generating apparatus and the plasma generating method according to the present invention have been described in detail above, but the present invention is not limited to the embodiment described above. It is apparent that various modifications and changes are possible without departing from the scope of the present invention. For example, the plasma generating apparatus according to the present invention can be suitably used not only as the CVD apparatus but also as an etching apparatus.

The invention claimed is:

1. A plasma generating apparatus using an antenna array including a plurality of antenna elements, each being formed of a rod-like conductor having a surface covered with a dielectric, and arranged in a planar manner, the plasma generating apparatus comprising:
a radio frequency power source for generating a radio frequency signal fed to each of the plurality of antenna elements of the antenna array;
impedance matching devices, each including a basic element having a characteristic parameter being variable for impedance matching and an auxiliary element having a characteristic parameter being variable, the impedance matching devices changing a combined characteristic parameter obtained by combining the characteristic parameter of the basic element and the characteristic parameter of the auxiliary element to change an impedance matching state of each of the plurality of antenna elements; and
a controller for adjusting an amount of the combined characteristic parameter of each of the impedance matching devices to perform the impedance matching of a whole antenna array,
wherein, in an adjusted state where the characteristic parameter of the auxiliary element is adjusted for each of the plurality of antenna elements to adjust the impedance matching for each of the plurality of antenna elements, the controller adjusts the characteristic parameter of the basic element of each of the plurality of antenna elements in synchronization with each other so as to perform the impedance matching of the whole antenna array.

2. The plasma generating apparatus according to claim 1, wherein, in the adjusted state, the controller increases or decreases the amount of the characteristic parameter of the basic element of each of the plurality of antenna elements by the same amount to perform the impedance matching of the whole antenna array.

3. The plasma generating apparatus according to claim 1, wherein:
the adjusted state is a state where the characteristic parameter of the auxiliary element is adjusted for each of the plurality of antenna elements while the characteristic parameters of the basic elements of all the plurality of antenna elements are fixed to the same amount to adjust the impedance matching for each of the plurality of antenna elements; and
the controller adjusts the characteristic parameter of the basic element of each of the plurality of antenna elements to the same amount to perform the impedance matching of the whole antenna array.

4. The plasma generating apparatus according to claim 1, wherein:
each of the impedance matching devices provided for each of the plurality of antenna elements includes a first parameter adjusting means connected to a power feeder for feeding the radio frequency signal to the plurality of antenna elements and a second parameter adjusting means joined with the antenna element; and the basic element and the auxiliary element are provided for each of the first capacitance adjusting means and the second capacitance adjusting means.

5. The plasma generating apparatus according to claim 4, wherein, in the first parameter adjusting means, a terminal of the basic element, the terminal being opposite to a side connected to the power feeder, and a terminal of the auxiliary element, the terminal being opposite to a side connected to the power feeder, are both connected to a grounded stub provided for the impedance matching of each of the plurality of antenna elements; and
in the second parameter adjusting means, a terminal of the basic element, the terminal being opposite to a side connected to the plurality of antenna elements, and a terminal of the auxiliary element, the terminal being opposite to a side connected to the plurality of antenna elements, are both connected to the stub.

6. The plasma generating apparatus according to of claim 1, wherein:
the characteristic parameter comprises a capacitance parameter for the impedance matching; and
each of the basic element and the auxiliary element comprises a capacitive element having the capacitance parameter being variable.

7. A plasma generating method for generating a plasma by using an antenna array and impedance matching devices, the antenna array including a plurality of antenna elements, each being formed of a rod-like conductor having a surface covered with a dielectric, arranged in a planar manner,
the impedance matching devices, each including a basic element having a characteristic parameter being variable for impedance matching, and an auxiliary element having a characteristic parameter being variable, the impedance matching devices changing a combined characteristic parameter obtained by combining the characteristic parameter of the basic element and the characteristic parameter of the auxiliary element to change an impedance matching state of each of the plurality of antenna elements,
the plasma generating method comprising:
in an adjusted state where the characteristic parameter of the auxiliary element is adjusted for each of the plurality of antenna elements while the characteristic parameter of the basic element of each of the plurality of respective antenna elements is fixed to adjust impedance matching for each of the plurality of antenna elements;
feeding a radio frequency signal to each of the plurality of antenna elements of the antenna array to cause an electromagnetic wave to be emitted from the plurality of antenna elements to generate the plasma; and
adjusting the characteristic parameter of the basic element of each of the plurality of antenna elements in synchronization with each other to perform the impedance matching of a whole antenna array.

8. The plasma generating method according to claim 7, wherein, when the impedance matching of the whole antenna array is performed, an amount of the characteristic parameter of the basic element of each of the plurality of antenna elements is increased or decreased by the same amount in the adjusted state to perform the impedance matching of the whole antenna array.

9. A plasma generating method according to claim 7, wherein the characteristic parameters of the basic elements of all the plurality of antenna elements are fixed to the same amount prior to generation of the plasma to generate the plasma in a fixed state, and the characteristic parameter of the auxiliary element is adjusted for each of the plurality of antenna elements so as to make reflection of radio frequency power zero to set the adjusted state where the impedance matching is adjusted for each of the plurality of antenna elements.

* * * * *